United States Patent
Chen et al.

(10) Patent No.: US 9,824,656 B2
(45) Date of Patent: Nov. 21, 2017

(54) GATE DRIVER UNIT, GATE DRIVER CIRCUIT AND DRIVING METHOD THEREOF, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Mo Chen, Beijing (CN); Jinliang Liu, Beijing (CN); Jian Zhao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/233,487

(22) Filed: Aug. 10, 2016

(65) Prior Publication Data

US 2017/0221439 A1    Aug. 3, 2017

(30) Foreign Application Priority Data

Feb. 1, 2016   (CN) .......................... 2016 1 0070100

(51) Int. Cl.
   *G09G 3/36*   (2006.01)

(52) U.S. Cl.
   CPC ... *G09G 3/3648* (2013.01); *G09G 2300/0426* (2013.01); *G09G 2310/08* (2013.01)

(58) Field of Classification Search
   CPC .............. G09G 3/3674; G09G 3/3677; G09G 2310/0267

(Continued)

(56) References Cited

U.S. PATENT DOCUMENTS

| 8,134,529 | B2 * | 3/2012 | Kim ..................... G09G 3/3677 345/100 |
| 2010/0158188 | A1 * | 6/2010 | Lee ..................... G09G 3/3677 377/79 |

(Continued)

FOREIGN PATENT DOCUMENTS

| CN | 103065592 A | 4/2013 |
| CN | 103680450 A | 3/2014 |
| CN | 104575436 A | 4/2015 |

OTHER PUBLICATIONS

Office Action dated Jul. 11, 2017 issued in corresponding Chinese Application No. 201610070100.0.

*Primary Examiner* — Roy Rabindranath
(74) *Attorney, Agent, or Firm* — Nath, Goldberg & Meyer; Joshua B. Goldberg

(57) ABSTRACT

A gate driver unit, a gate driver circuit and a driving method thereof, and a display device are disclosed. In the gate driver unit, an input module is configured to pull up a voltage at a pulling-up node to a high level, the pulling-up node being a connection node of an output end of the input module and a control end of an output module; the output module is configured to output a gate driving signal under a control of a second clock signal; a pulling-up module is configured to reverse the voltage at the pulling-up node under a control of a fourth clock signal; a pulling-down module is configured to reverse a voltage at an output end of the output module under a control of the second clock signal; and a reset module is configured to reset the output end of the output module.

12 Claims, 4 Drawing Sheets

(58) Field of Classification Search
USPC .......................................................... 345/100
See application file for complete search history.

(56) References Cited

U.S. PATENT DOCUMENTS

2015/0339997 A1    11/2015   Yang et al.
2016/0071614 A1*   3/2016   Lee ........................ G09G 5/006
                                                                                                    345/214
2016/0372070 A1*   12/2016   Hu ......................... G09G 3/3614

* cited by examiner

GATE DRIVER UNIT, GATE DRIVER CIRCUIT AND DRIVING METHOD THEREOF, AND DISPLAY DEVICE

CROSS-REFERENCES TO RELATED APPLICATIONS

The present application claims priority to Chinese Patent Application No. 201610070100.0, filed on Feb. 1, 2016, the disclosure of which is hereby incorporated by reference in its entirety.

FIELD

The present invention relates to the field of display technology, and particularly, to a gate driver unit, a gate driver circuit and a driving method thereof, and a display device.

BACKGROUND

At present, a liquid crystal display panel includes a matrix of pixels, and in a display process, a gate driver circuit is controlled to output gate scanning signals, thereby realizing progressive scanning to access respective rows of pixels, and realizing image display in cooperation with image data.

The gate driver circuit is configured to generate a gate scanning voltage for a pixel, while Gate driver on Array (GOA) is a technique in which the gate driver circuit is integrated with an array substrate. In the gate driver circuit, each GOA gate driver unit as a shift register successively transmits scanning signals to the next GOA gate driver unit, so as to switch on thin film transistors (TFTs) row by row, thereby completing input of data signals to each row of pixel units. As a kind of particular gate driver circuit, GOA bi-directional scanning circuit can control the gate scanning signals to realize forward scanning or backward scanning by only changing the timing sequence of input signals, without changing the physical structure of GOA gate driver unit.

An oxide thin film transistor (Oxide TFT) display panel is a display panel in which a semiconductor layer of TFTs is made of a metal oxide material, and has advantages such as high electron mobility, large aperture ratio and the like. However, in conventional GOA gate driver units, a gate of a thin film transistor operates in a low voltage state for a long time, which easily leads to changes in its characteristics, experiencing a threshold voltage Vth drifting phenomenon. Particularly, Oxide TFT is liable to be affected by a single bias voltage, so that the stability of GOA gate driver unit becomes poor in a long display process of a display panel, thereby disturbing the output of regular scanning signals.

From above it can be seen that designing a GOA gate driver unit with simple structure and capable of maintaining the stability of TFTs becomes a technical problem to be solved urgently in the art.

SUMMARY

In view of at least the above shortcomings in the prior art, the present invention provides a gate driver unit, a gate driver circuit and a driving method thereof, and a display device. By employing the gate driver unit, it is possible to realize bi-directional scanning, and to prevent gates of the thin film transistors therein from operating under a single bias voltage for a long time, thereby maintaining the stability of the gate driver circuit.

According to an embodiment of the present invention, there is provided a. gate driver unit, comprising an input module, an output module, a pulling-up module, a pulling-down module and a reset module, wherein, the input module is connected with a first signal input end, a second signal input end, a first clock signal input end, a third clock signal input end and a pulling-up node, respectively, and is configured to pull up a voltage at the pulling-up node to a high level, the pulling-up node being a connection node of an output end of the input module and a control end of the output module; the output module is connected with a second clock signal input end, the pulling-up node and an output end of the gate driver unit, respectively, and is configured to output a gate driving signal under a control of a second clock signal input from the second clock signal input end, the output end of the gate driver unit being a connection node of an output end of the pulling-down module and an output end of the output module; the pulling-up module is connected with a fourth clock signal input end and the pulling-up node, respectively, and is configured to reverse the voltage at the pulling-up node under a control of a fourth clock signal input from the fourth clock signal input end; the pulling-down module is connected with the second clock signal input end, the pulling-up node, the output end of the gate driver unit and a reference voltage input end, and is configured to reverse a voltage at the output end of the output module under a control of the second clock signal input from the second clock signal input end; and the reset module is connected with the first clock signal input end, the third clock signal input end and the reference voltage input end, and is configured to reset the output end of the output module.

Optionally, the input module comprises a first transistor and a second transistor, wherein, the first transistor has a gate connected with the first clock signal input end, a first electrode connected with the first signal input end, and a second electrode connected with the pulling-up node; and the second transistor has a gate connected with the third clock signal input end, a first electrode connected with the second signal input end, and a second electrode connected with the pulling-up node.

Optionally, the output module comprises a third transistor and a first capacitor, wherein, the third transistor has a gate connected with the pulling-up node, a first electrode connected with the second clock signal input end, and a second electrode connected with the pulling-down module and the reset module, a connection node of the second electrode of the third transistor with the pulling-down module and the reset module being the output end of the output module; and the first capacitor has a first end connected with the pulling-up node and a second end connected with the output end of the output module.

Optionally, the pulling-up module comprises a fourth transistor, a gate of which is connected with a first electrode thereof and further connected with the fourth clock signal input end, and a second electrode of the fourth transistor is connected with the pulling-up node.

Optionally, the pulling-down module comprises a second capacitor, a fifth transistor, a sixth transistor and a seventh transistor, wherein, the second capacitor has a first end connected with the second clock signal input end and a second end connected with a second electrode of the fifth transistor, a pulling-down node being a connection node of the second end of the second capacitor with the second electrode of the fifth transistor; the fifth transistor has a gate connected with the pulling-up node, a first electrode connected with the reference voltage input end, and a second electrode connected with the second end of the second capacitor; the sixth transistor has a gate connected with the pulling-down node, a first electrode connected with the reference voltage input end, and a second electrode connected with the pulling-up node; and the seventh transistor has a gate connected with the pulling-down node, a first electrode connected with the reference voltage input end, and a second electrode connected with the output end of the gate driver unit.

Optionally, the reset module comprises an eighth transistor and a ninth transistor, wherein, the eighth transistor has a gate connected with the first clock signal input end, a first electrode connected with the reference voltage input end, and a second electrode connected with the output end of the gate driver unit; and the ninth transistor has a gate connected with the third clock signal input end, a first electrode connected with the reference voltage input end, and a second electrode connected with the output end of the gate driver unit.

Embodiments of the present invention further provide a gate driver circuit, comprising a plurality of above-described gate driver units which are cascaded, and each gate driver unit corresponds to a gate line and provides a gate driving signal to the corresponding gate line.

Embodiments of the present invention further provide a display device, comprising the above-described gate driver circuit.

Embodiments of the present invention further provide a driving method of a gate driver circuit comprising a plurality of the gate driver units described herein, wherein, when an N-th gate line is being driven, the driving method of the gate driver unit corresponding to the N-th gate line comprises an input and hold stage, an output stage and a reset stage, wherein, in the input and hold stage, the input module, under a control of the first clock signal, receives an output signal from the output module of the gate driver unit corresponding to an (N−1)-th gate line as an input signal, and stores the input signal at the pulling-up node; the pulling-up module holds a voltage at the pulling-up node under a control of the fourth clock signal; in the output stage, the output module outputs a gate driving signal for the stage of its own to drive the N-th gate line under a control of the second clock signal; and in the reset stage, under a control of the third clock signal, an output signal of the output module of the gate driver unit corresponding to an (N+1)-th gate line is used as a reset signal to reset a voltage at the output end of the output module of the gate driver unit corresponding to the N-th gate line.

Optionally, when a gate line other than the N-th gate line is being driven, the driving method of the gate driver unit corresponding to the N-th gate line further comprises a level hold stage and a level reverse stage, wherein, in the level hold stage, voltages at the pulling-up node and the pulling-down node are hold at a low level under a control of the first clock signal and the third clock signal; and in the level reverse stage, the voltages at the pulling-up node and the pulling-down node are reversed under a control of the fourth clock signal.

Optionally, duration of active level of each of the first clock signal, the second clock signal, the third clock signal and the fourth clock signal is a quarter period, and the active level is a high level.

Optionally, a forward driving mode or a backward driving mode is employed, wherein, in the forward driving mode, the first clock signal, the second clock signal, the third clock signal and the fourth clock signal are successively set to be the active level, and the active levels of these clock signals are successively lagged a quarter period; and in the backward driving mode, the fourth clock signal, the third clock signal, the second clock signal and the first clock signal are successively set to be the active level, and the active levels of these clock signals are successively lagged a quarter period; and wherein, the fourth clock signal in the backward driving mode is a quarter period ahead of the first clock signal in the forward driving mode.

The present invention has the following beneficial effects: with designs of structure and corresponding scanning sequence, the gate driver unit and corresponding gate driver circuit described herein are capable of ensuring that each thin film transistor of the GOA gate driver unit is in a state in which the gate voltage thereof is alternatively changed between positive and negative levels while bi-directional transmission of scanning signals is realized, so that the thin film transistor is effectively avoided to be affected by a single bias voltage, the shift of the threshold voltage Vth of the thin film transistor is suppressed, and the stability of the scanning signals output from the GOA gate driver unit is improved.

DETAILED DESCRIPTION OF THE EMBODIMENTS

To make those skilled in the art better understand the technical solutions of the present invention, the gate driver unit, the gate driver circuit and the driving method thereof, and the display device described herein will be further described below in detail in conjunction with accompanying drawings and specific embodiments.

First Embodiment

The present embodiment provides a GOA gate driver unit, in which a gate of a thin film transistor can be avoided to be operated in a single voltage for a long time while the bi-directional scanning can be achieved, so that the stability of a gate driver circuit can be maintained.

In the present embodiment, the description of the specific structure of the gate driver unit will be made by taking an N-th stage of GOA gate driver unit as an example. The hardware configuration of the gate driver unit includes nine thin film transistors T (i.e., T1 to T9) and two capacitors C (i.e., C1 and C2), and signal ends include four clock signal input ends CLK (i.e., CLK1 to CLK4), a reference voltage input end Vss, two inter-gate-driver-unit signal input ends Input (i.e., Input1(G[N−1]) and Input2(G[N+1])), and a signal output end G[N].

Figure 1:
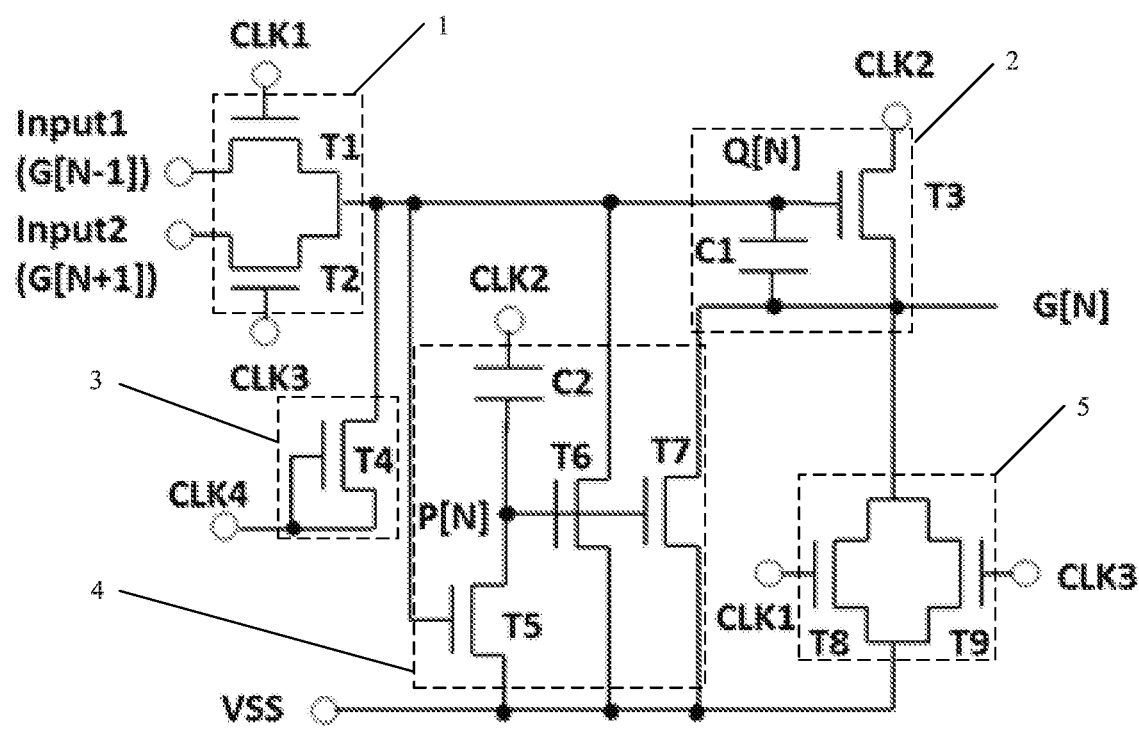
FIG. 1 is a circuit diagram of an N-th stage of GOA driver unit provided in a first embodiment of the present invention.

As shown in FIG. 1, the gate driver unit includes an input module 1, an output module 2, a pulling-up module 3, a pulling-down module 4 and a reset module 5.

The input module 1 is connected with a first signal input end Input1(G[N−1]), a second signal input end Input2(G[N+1]), a first clock signal input end CLK1, a third clock signal input end CLK3 and a pulling-up node Q[N], respectively, and is configured to pull up a voltage at the pulling-up node Q[N] to a high level, the pulling-up node Q[N] being a connection node of an output end of the input module 1 and a control end of the output module 2.

The output module 2 is connected with a second clock signal input end CLK2, the pulling-up node Q[N] and a signal output end G[N] (hereinafter, an output end G[N] in short) of the present gate driver unit, respectively, and is configured to output a gate driving signal under a control of a second clock signal input from the second clock signal input end CLK2, the output end G[N] being a connection node of an output end of the pulling-down module 4 and an output end of the output module 2.

The pulling-up module 3 is connected with a fourth clock signal input end CLK4 and the pulling-up node QM respectively, and is configured to reverse the voltage at the pulling-up node Q[N] under a control of a fourth clock signal input from the fourth clock signal input end CLK4.

The pulling-down module 4 is connected with the second clock signal input end CLK2, the pulling-up node Q[N], the output end G[N] and a reference voltage input end Vss, and is configured to reverse a voltage at the output end of the output module 2 under a control of the second clock signal input from the second clock signal input end CLK2, that is, the voltage at the output end G[N] is reversed.

The reset module 5 is connected with the first clock signal input end CLK1, the third clock signal input end CLK3 and the reference voltage input end Vss, and is configured to reset the output end of the output module 2.

Specifically, the input module 1 comprises a first transistor T1 and a second transistor T2, wherein, the first transistor T1 has a gate connected with the first clock signal input end CLK1, a first electrode connected with the first signal input end Input1(G[N−1]), and a second electrode connected with the pulling-up node Q[N]; and the second transistor T2 has a gate connected with the third clock signal input end CLK3, a first electrode connected with the second signal input end Input2(G[N+1]), and a second electrode connected with the pulling-up node Q[N].

The output module 2 comprises a third transistor T3 and a first capacitor C1, wherein, the third transistor T3 has a gate connected with the pulling-up node Q[N], a first electrode connected with the second clock signal input end CLK2, and a second electrode connected with the pulling-down module 4 and the reset module 5, a connection node of the second electrode of the third transistor T3 with the pulling-down module 4 and the reset module 5 being the output end of the output module 2; and the first capacitor C1 has a first end connected with the pulling-up node Q[N] and a second end connected with the output end of the output module 2.

The pulling-up module 3 comprises a fourth transistor T4, a gate of which is connected with a first electrode thereof and further connected with the fourth signal input end CLK4, and a second electrode of the fourth transistor T4 is connected with the pulling-up node Q[N].

The pulling-down module 4 comprises a second capacitor C2, a fifth transistor T5, a sixth transistor T6 and a seventh transistor T7, wherein, the second capacitor C2 has a first end connected with the second clock signal input end CLK2 and a second end connected with a second electrode of the fifth transistor T5, a pulling-down node P[N] being a connection node of the second end of the second capacitor C2 with the second electrode of the fifth transistor T5; the fifth transistor T5 has a gate connected with the pulling-up node Q[N], a first electrode connected with the reference voltage input end Vss, and a second electrode connected with the second end of the second capacitor C2; the sixth transistor T6 has a gate connected with the pulling-down node P[N], a first electrode connected with the reference voltage input end Vss, and a second electrode connected with the pulling-up node Q[N]; and the seventh transistor T7 has a gate connected with the pulling-down node P[N], a first electrode connected with the reference voltage input end Vss, and a second electrode connected with the output end G[N].

The reset module 5 comprises an eighth transistor T8 and a ninth transistor T9, wherein, the eighth transistor T8 has a gate connected with the first clock signal input end CLK1, a first electrode connected with the reference voltage input end Vss, and a second electrode connected with the output end G[N]; and the ninth transistor T9 has a gate connected with the third clock signal input end CLK3, a first electrode connected with the reference voltage input end Vss, and a second electrode connected with the output end G[N].

In the gate driver unit of the present embodiment, each of the first transistor T1 to the ninth transistor T9 may be an N-type thin film transistor, and the first electrode of the N-type thin film transistor may be a source electrode and the second electrode thereof may be a drain electrode; alternatively, each of the first transistor T1 to the ninth transistor T9 may be a P-type thin film transistor, and the first electrode of the P-type thin film transistor may be a drain electrode and the second electrode thereof may be a source electrode; alternatively, some of the first transistor T1 to the ninth transistor T9 may be N-type thin film transistors, and the others may be P-type thin film transistors, that is, the N-type thin film transistors and the P-type thin film transistors can be employed in a mixed manner, and it is only necessary to make changes on connections in accordance with the polarities of respective terminals of the selected type of the first transistor T1 to the ninth transistor T9, details of which will not be described herein.

The present embodiment further provides a gate driver circuit, which is capable of ensuring that each thin film transistor therein is in a state in which the gate voltage thereof is alternatively changed between positive and negative levels while realizing bi-directional transmission of scanning signals, so that the shift of the threshold voltage Vth of each thin film transistor is suppressed.

Figure 2:
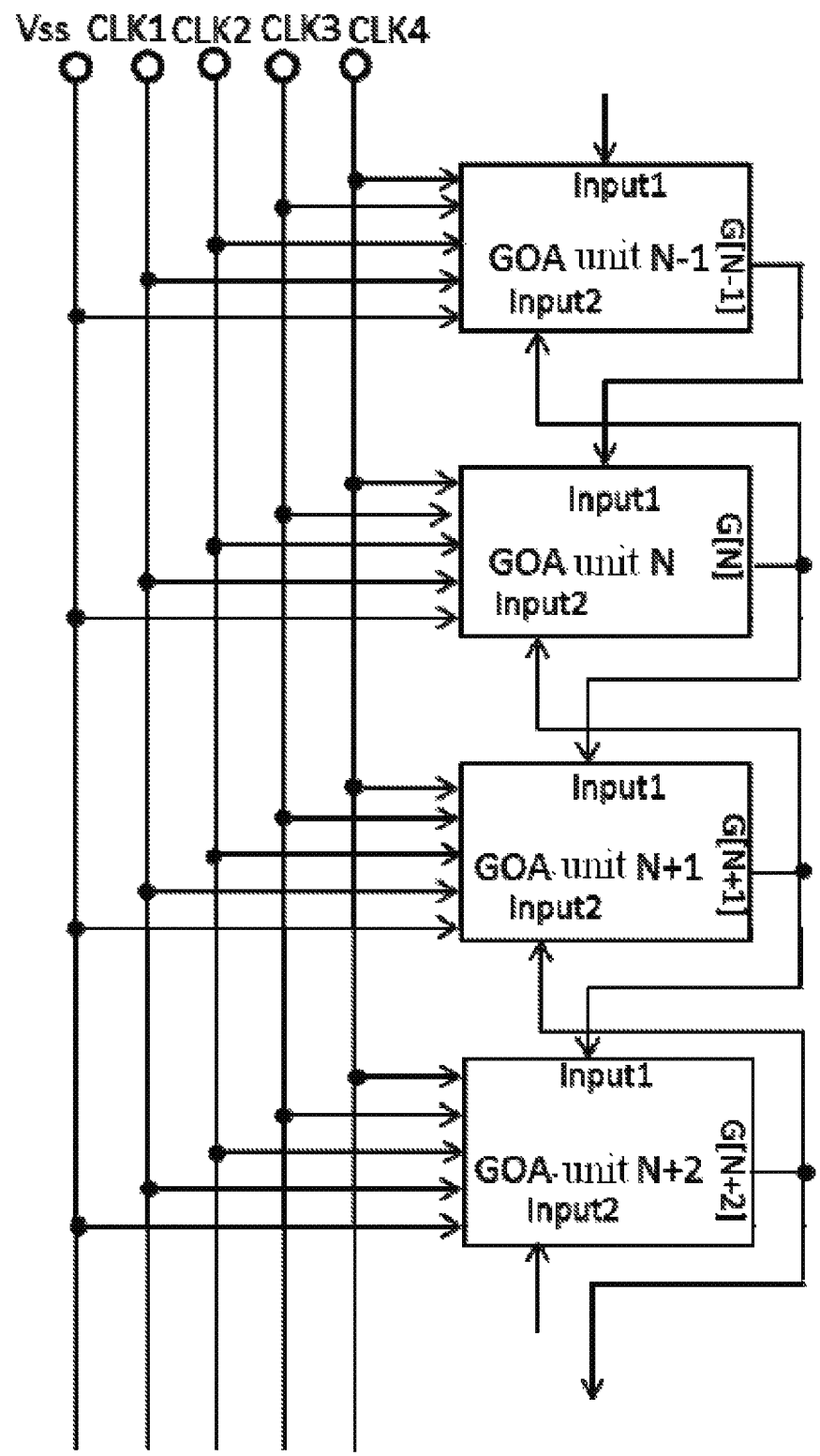
FIG. 2 is a schematic diagram illustrating a gate driver circuit formed by cascading a plurality of GOA gate driver unit.

As shown in FIG. 2, the gate driver circuit includes a plurality of gate driver units which are cascaded, each of the gate driver units corresponds to a gate line and provides gate driving signals to the corresponding gate line. Similar to the structure of the gate driver unit shown in FIG. 1, the hardware configuration of each gate driver unit in the gate driver circuit also includes nine thin film transistors T (i.e., T1 to T9) and two capacitors C (i.e., C1 and C2), and signal ends also include four clock signal input ends CLK (i.e., CLK1 to CLK4), a reference voltage input end Vss, two inter-gate-driver-unit signal input ends Input (i.e., Input1 and Input2), and a signal output end G.

Accordingly, the present embodiment further provides a driving method of the gate driver circuit, which is capable of ensuring that each thin film transistor therein is in a state in which the gate voltage thereof is alternatively changed between positive and negative levels while realizing bi-directional transmission of scanning signals, so that the shift of the threshold voltage Vth of each thin film transistor is suppressed, and the stability of the scanning signals output from the GOA gate driver units is improved.

In the driving method of the gate driver circuit, when an N-th gate line is being driven, the driving method of the gate driver unit corresponding to the N-th gate line includes an input and hold stage, an output stage and a reset stage, wherein, in the input and hold stage, the input module 1, under a control of the first clock signal, receives an output signal from an output module 2 of a gate driver unit corresponding to the previous gate line (i.e., an (N−1)-th gate line) as an input signal, and stores the input signal at the pulling-up node Q[N], and, the pulling-up module 3 holds a voltage at the pulling-up node Q[N] under a control of the fourth clock signal; in the output stage, the output module 2 of the gate driver unit corresponding to the N-th gate line outputs a gate driving signal to drive the present gate line (i.e., the N-th gate line) under a control of the second dock signal; and in the reset stage, under a control of the third clock signal, an output signal of an output module 2 of a gate driver unit corresponding to the next gate line (i.e., an (N+1)-th gate line) is used as a reset signal to reset a voltage at the output end of the output module 2 of the gate driver unit corresponding to the present gate line (i.e., the N-th gate line).

In the present embodiment, the first clock signal, the second clock signal, the third clock signal and the fourth clock signal are clock signals input from the first clock signal input end CLK1, the second clock signal input end CLK2, the third clock signal input end CLK3 and the fourth clock signal input end CLK4, respectively, duration of active level of each of them is a quarter period, and the active level is a high level.

As a driving mode of the gate driver circuit, a forward driving mode is employed, i.e., the first clock signal, the second clock signal, the third clock signal and the fourth clock signal are successively set to be the active level, and the active levels of these clock signals are successively lagged a quarter period.

Figure 3:
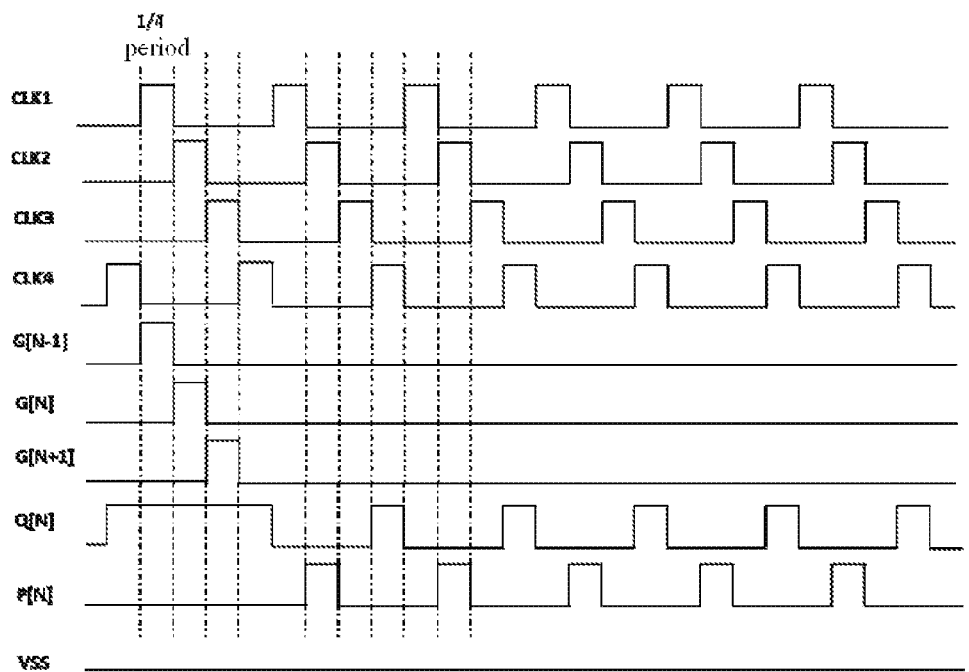
FIG. 3 is a forward scanning waveform sequence diagram, taking the N-th stage of GOA driver unit shown in FIG. 1 as an example.

The description of the working principle of the gate driver circuit will be made in detail by taking a gate driver circuit which is formed by cascading the GOA gate driver units shown in FIG. 1 as an example, in conjunction with a forward scanning waveform sequence diagram as shown in FIG. 3. Specifically:

(1) In a first quarter clock period, the first clock signal is at a high level, so that the first transistor T1 and the eighth transistor T8 are turned on, the first signal input end Input1 (G[N−1]) inputs a high level signal with a quarter clock period through the first transistor T1, indicating a start of the driving period of the N-th stage of GOA gate driver unit, and at this time, the high level signal is stored in the first capacitor C1, so that the pulling-up node Q[N] maintains at the high level, which enables the third transistor T3 to be turned on. At this time, the second clock signal is at a low level, so that the output end G[N] outputs a low level signal, and meanwhile, the turned on of the eighth transistor T8 enables the output end G[N] to be at a low level which is input from the reference voltage input end Vss; the high level at the pulling-up node Q[N] also enables the fifth transistor T5 to be turned on, so that the pulling-down node P[N] is at the low level which is input from the reference voltage input end Vss; the low level at the pulling-down node P[N] enables the sixth transistor T6 to be turned off, and at this time, the third clock signal is at a low level, so that the second transistor T2 is turned off, and the fourth clock signal is at a low level, so that the fourth transistor T4 is turned off, therefore, the pulling-up node Q[N] will not be affected by the low level signal.

(2) In a next quarter clock period (i.e., a second quarter clock period), the first clock signal is at a low level, so that the first transistor T1 is turned off, and at this time, as the second transistor T2, the fourth transistor T4 and the sixth transistor T6 are maintained to be turned off, the pulling-up node Q[N] will not be affected by the low level signal. The first capacitor C1 enables the pulling-up node Q[N] to be maintained at the high level, so that the pulling-up node Q[N] maintains the third transistor T3 to be turned on. The second clock signal is at a high level, so that the output end Q[N] outputs a high level signal, starting scanning on a present row of pixels. At this time, each of the seventh transistor T7, the eighth transistor T8 and the ninth transistor T9 is turned off, so that the output end G[N] will not be affected by the low level of the reference voltage input end Vss.

(3) In a next quarter clock period (i.e., a third quarter clock period), the third clock signal is at a high level, so that the second transistor T2 and the ninth transistor T9 are turned on. The second signal input end Input2(G[N+1]) inputs a high level signal through the second transistor T2, so that the pulling-up node Q[N] is maintained at the high level, the third transistor T3 is maintained to be turn on. The second clock signal is at a low level, so that the output end G[N] outputs a low level signal, and meanwhile, the reference voltage input end Vss pulls down the output end G[N] to be at a low level through the ninth transistor T9. In this case, signal level at the output end G[N] is rapidly pulled down, and the driving period of the N-th stage of GOA driver unit is completed.

Herein, the signal input from the reference voltage input end Vss is a low level direct current signal. The first to the fourth clock signal input ends CLK1 to CLK4 input clock signals with a same period and different phases, low level of each clock signal is equal to low level of the reference voltage input end Vss, and high levels of respective clock signals occupy a quarter period respectively. Signals from the output end G[N] of the N-th stage of GOA gate driver unit are used as scanning signals to control ON and OFF status of the thin film transistors in a corresponding row of pixels, while signals from the output end G[N−1] of the (N−1)-th stage of GOA gate driver unit and signals from the output end G[N+1] of the (N+1)-th stage of GOA gate driver unit are used as signals input from the first signal input end Input1(G[N−1]) and signals input from the second signal input end Input2(G[N+1]) of the N-th stage of GOA driver unit, respectively.

Further, when a gate line other than the N-th gate line is being driven, the driving method of the gate driver unit corresponding to the N-th gate line comprises a level hold stage and a level reverse stage, wherein, in the level hold stage, voltages at the pulling-up node Q[N] and the pulling-down node P[N] are hold at a low level under a control of the first clock signal and the third clock signal; and in the level reverse stage, the voltages at the pulling-up node Q[N] and the pulling-down node P[N] are reversed under a control of the fourth clock signal. In other words, the voltage at the pulling-up node Q[N] is reversed from a low level to a high level, and the voltage at the pulling-down node P[N] is reversed from a high level to a low level. Specifically, (4) In a non-driving period of the N-th stage of GOA gate driver unit: in the level hold stage, the first clock signal is at a high level, the first transistor T1 and the eighth transistor T8 are controlled to be turned on, the first signal input end Input1 (G[N−1]) inputs a low level signal through the first transistor T1, so that the voltage at the pulling-up node Q[N] is maintained at a low level, the reference voltage input end Vss enables the output end G[N] to be maintained at a low level through the eighth transistor T8, and the voltage at the pulling-down node P[N] is maintained at a low level; the third clock signal is at a high level, the second transistor T2 and the ninth transistor T9 are controlled to be turned on, the second signal input end Input2(G[N+1]) inputs a low level signal through the second transistor T2, so that the voltage at the pulling-up node Q[N] is maintained at a low level, the reference voltage input end Vss enables the output end G[N] to be maintained at a low level through the ninth transistor T9, and meanwhile, the voltage at the pulling-down node P[N] is maintained at a low level. In the level reverse stage, the second clock signal is at a high level, the voltage at the pulling-up node Q[N] is at a low level, the fifth transistor T5 is controlled to be turned off, and the voltage at the pulling-down node P[N] is pulled up to a high level under a control of coupling of the second clock signal and the second capacitor C2, so that the sixth transistor T6 and the seventh transistor T7 are turned on, the reference voltage input end Vss enables the voltage at the pulling-up node Q[N] to be maintained at a low level through the sixth transistor T6, and the reference voltage input end Vss also enables the voltage at the output end G[N] to be maintained at a low level through the seventh transistor T7, so that the influence on the output end G[N] caused by the second dock signal which is at high level is reduced, thereby a noise-reduction effect is realized. The fourth clock signal is at a high level, the fourth transistor T4 is controlled to be turned on, so that the high level signal of the fourth clock signal is transmitted to the pulling-up node Q[N], and under an alternate action of the second clock signal and the fourth clock signal, the voltage at the pulling-up node Q[N] is alternatively changed between positive and negative levels, so that the drift of the threshold voltage Vth of the third transistor T3 is suppressed. The high level at the pulling-up node Q[N] enables the third transistor T3 to be turned on, the output end G[N] is maintained at a low level in synchronization with the second clock signal, and the voltage at the pulling-down node P[N] is maintained at a low level.

In the present embodiment, under the alternate action of the second clock signal and the fourth clock signal, the voltage at the pulling-up node Q[N] is alternatively changed between positive and negative levels, so that the drift of the threshold voltage Vth of the third transistor T3 is suppressed. Moreover, under the alternate action of the second clock signal and the fourth clock signal, the voltage at the pulling-down node P[N] is also alternatively changed between positive and negative levels, so that the drift of threshold voltage Vth of each of the sixth transistor T6 and the seventh transistor T7 is suppressed. Meanwhile, the gate signal of each thin film transistor is directly controlled by its corresponding clock signal, and is also alternatively changed between positive and negative levels.

It can be seen from the above that, the gate voltage of each of the first transistor T1 to the ninth transistor T9 of the gate driver unit is alternatively changed between positive and negative levels, so that the influence on the thin film transistor due to the single bias voltage can be effectively avoided, and the drift of the threshold voltage Vth of the thin film transistor can be suppressed. The stability of the gate driver unit can be effectively maintained even in a case where the gate driver unit is formed by thin film transistors made of a metal oxide.

As another driving mode of the gate driver circuit, a backward driving mode is employed, in which the fourth clock signal, the third clock signal, the second clock signal and the first clock signal are successively set to be the active level, and the active levels of these clock signals are successively lagged a quarter period; moreover, the fourth clock signal in the backward driving mode is a quarter period ahead of the first clock signal in the forward driving mode.

Figure 5:
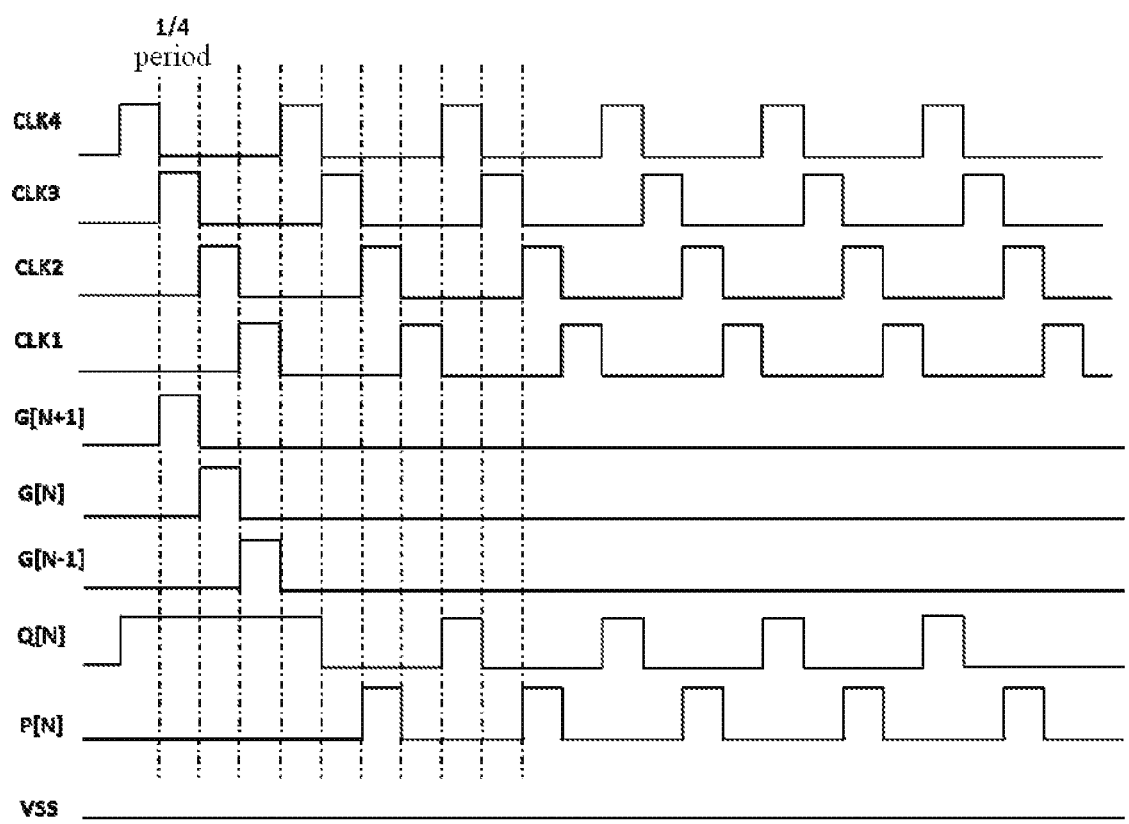
FIG. 5 is a backward scanning waveform sequence diagram, taking the N-th stage of GOA driver unit shown in FIG. 1 as an example.

Taking the above described N-th stage of GOA gate driver unit as an example, when the scanning signals are backward transmitted, the sequence of the N-th stage of GOA gate driver unit is as shown in FIG. 5. The output end G(N+1) of the (N+1)-th stage of GOA gate driver unit inputs a high level signal, indicating the start of the driving period of the N-th stage of GOA gate driver unit, and the output end G(N−1) of the (N−1)-th stage of GOA gate driver unit outputs a high level signal to the N-th stage of GOA driver unit, indicating the end of the driving period of the N-th gate of GOA driver unit. The first transistor T1 and the second transistor T2 are provided symmetrically, and the eighth transistor T8 and the ninth transistor T9 are provided symmetrically, and when the scanning signals are forward or backward transmitted, the function of the first transistor T1 and the function of the second transistor T2 can be replaced by each other, the function of the eighth transistor T8 and the function of the ninth transistor T9 can be replaced by each other, the functions of other thin film transistors remain unchanged.

Figure 4:
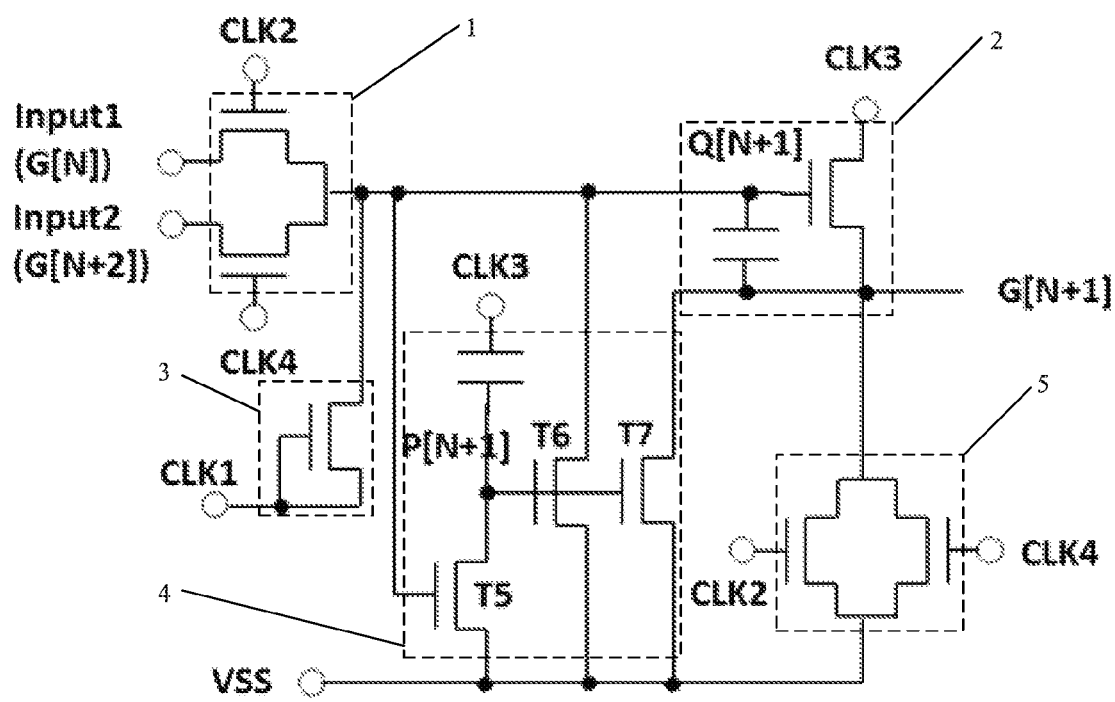
FIG. 4 is a circuit diagram of an (N+1)-th stage of GOA driver unit provided in the first embodiment of the present invention.

In addition, with respect to the GOA gate driver unit in a former stage, the clock signal input ends CLK corresponding to the external signal input ends of the GOA gate driver unit in a later stage are successively changed. As shown in FIG. 4 and taking the (N+1)-th stage of GOA gate driver unit as an example, with respect to the N-th stage of GOA gate driver unit shown in FIG. 1, the gate of the first transistor T1 of the (N+1)-th stage of GOA gate driver unit is connected with the second clock signal input end CLK2 instead of the first clock signal input end CLK1, the first electrode of the third transistor T3 is connected with the third clock signal input end CLK3 instead of the second clock signal input end CLK2, the gate of the second transistor T2 is connected with the fourth clock signal input end CLK4 instead of the third clock signal input end CLK3, and the gate and the first electrode of the fourth transistor T4 is connected with the first clock signal input end CLK1 instead of the fourth clock signal input end CLK4. The arrangement manner of the clock signal input ends CLK in the other GOA gate driver units are similar to the above manner, and will not be described in detail herein.

It should be understood that, as a specific case, when the forward scanning mode is employed, the GOA gate driver unit in the first stage uses a STV frame start-up signal as the signal input from the first signal input end Input1, and when the backward scanning mode is employed, the GOA gate driver unit in the last stage uses the STV frame start-up signal as the signal input from the second signal input end Input2.

With designs of structure and corresponding scanning sequence, the gate driver unit and corresponding gate driver circuit described in the present embodiment are capable of ensuring that each thin film transistor of the GOA gate driver unit is in a state in which the gate voltage thereof is alternatively changed between positive and negative levels while realizing bi-directional transmission of scanning signals, so that the thin film transistor is effectively avoided to be affected by a single bias voltage, the shift of the threshold voltage Vth of the thin film transistor is suppressed, and the stability of the scanning signals output from the GOA gate driver unit is improved.

Second Embodiment

The present embodiment provides a display device, comprising the gate driver circuit described in the first embodiment.

The display device may be any product or part having a display function, such as a liquid crystal panel, an electronic paper, a mobile phone, a tablet computer, a television, a display, a laptop computer, a digital frame, a navigator and the like.

As the gate driver unit and its corresponding gate driver circuit in the first embodiment is employed, the display device in the present embodiment has a better stability, a better display effect, and a longer service life.

It could be understood that the above embodiments are merely exemplary embodiments adopted for describing the principle of the present invention, but the present invention is not limited thereto. Various variations and improvements may be made for those with ordinary skill in the art without departing from the spirit and essence of the present invention, and these variations and improvements shall also fall within the protection scope of the present invention.

What is claimed is:

1. A gate driver unit, comprising an input module, an output module, a pulling-up module, a pulling-down module and a reset module, wherein,
   the input module is connected with a first signal input end, a second signal input end, a first clock signal input end, a third clock signal input end and a pulling-up node, respectively, and is configured to pull up a voltage at the pulling-up node to a high level, the pulling-up node being a connection node of an output end of the input module and a control end of the output module;
   the output module is connected with a second clock signal input end, the pulling-up node and an output end of the gate driver unit, respectively, and is configured to output a gate driving signal under a control of a second clock signal input from the second clock signal input end, the output end of the gate driver unit being a connection node of an output end of the pulling-down module and an output end of the output module;
   the pulling-up module is connected with a fourth clock signal input end and the pulling-up node, respectively, and is configured to reverse the voltage at the pulling-up node under a control of a fourth clock signal input from the fourth clock signal input end;
   the pulling-down module is connected with the second clock signal input end, the pulling-up node, the output end of the gate driver unit and a reference voltage input end, and is configured to reverse a voltage at the output end of the output module under a control of the second clock signal input from the second dock signal input end; and
   the reset module is connected with the first clock signal input end, the third clock signal input end and the reference voltage input end, and is configured to reset the output end of the output module.

2. The gate driver unit of claim 1, wherein the input module comprises a first transistor and a second transistor, wherein,
   the first transistor has a gate connected with the first clock signal input end, a first electrode connected with the first signal input end, and a second electrode connected with the pulling-up node; and
   the second transistor has a gate connected with the third clock signal input end, a first electrode connected with the second signal input end, and a second electrode connected with the pulling-up node.

3. The gate driver unit of claim 1, wherein the output module comprises a third transistor and a first capacitor, wherein,
   the third transistor has a gate connected with the pulling-up node, a first electrode connected with the second clock signal input end, and a second electrode connected with the pulling-down module and the reset module, a connection node of the second electrode of the third transistor with the pulling-down module and the reset module being the output end of the output module; and
   the first capacitor has a first end connected with the pulling-up node and a second end connected with the output end of the output module.

4. The gate driver unit of claim 1, wherein the pulling-up module comprises a fourth transistor, a gate of which is connected with a first electrode thereof and further connected with the fourth clock signal input end, and a second electrode of the fourth transistor is connected with the pulling-up node.

5. The gate driver unit of claim 1, wherein the pulling-down module comprises a second capacitor, a fifth transistor, a sixth transistor and a seventh transistor, wherein,
   the second capacitor has a first end connected with the second clock signal input end and a second end connected with a second electrode of the fifth transistor, a pulling-down node being a connection node of the second end of the second capacitor with the second electrode of the fifth transistor;
   the fifth transistor has a gate connected with the pulling-up node, a first electrode connected with the reference voltage input end, and a second electrode connected with the second end of the second capacitor;
   the sixth transistor has a gate connected with the pulling-down node, a first electrode connected with the reference voltage input end, and a second electrode connected with the pulling-up node; and
   the seventh transistor has a gate connected with the pulling-down node, a first electrode connected with the reference voltage input end, and a second electrode connected with the output end of the gate driver unit.

6. The gate driver unit of claim 1, wherein the reset module comprises an eighth transistor and a ninth transistor, wherein,
   the eighth transistor has a gate connected with the first clock signal input end, a first electrode connected with the reference voltage input end, and a second electrode connected with the output end of the gate driver unit; and
   the ninth transistor has a gate connected with the third clock signal input end, a first electrode connected with the reference voltage input end, and a second electrode connected with the output end of the gate driver unit.

7. A gate driver circuit, comprising a plurality of gate driver units of claim 1 which are cascaded, and each gate driver unit corresponds to a gate line and provides a gate driving signal to the corresponding gate line.

8. A display device, comprising the gate driver circuit of claim 7.

9. A driving method of a gate driver circuit comprising a plurality of the gate driver units of claim 1, wherein, when an N-th gate line is being driven, the driving method of the gate driver unit corresponding to the N-th gate line comprises an input and hold stage, an output stage and a reset stage, wherein, in the input and hold stage, the input module, under a control of the first clock signal, receives an output signal from the output module of the gate driver unit corresponding to an (N−1)-th gate line as an input signal, and stores the input signal at the pulling-up node; and the pulling-up module holds a voltage at the pulling-up node under a control of the fourth clock signal;

in the output stage, the output module outputs a gate driving signal for the stage of its own to drive the N-th gate line under a control of the second clock signal; and in the reset stage, under a control of the third clock signal, an output signal of the output module of the gate driver unit corresponding to an (N+1)-th gate line is used as a reset signal to reset a voltage at the output end of the output module of the gate driver unit corresponding to the N-th gate line.

10. The driving method of the gate driver circuit of claim 9, wherein, when a gate line other than the N-th gate line is being driven, the driving method of the gate driver unit corresponding to the N-th gate line further comprises a level hold stage and a level reverse stage, wherein, in the level hold stage, voltages at the pulling-up node and the pulling-down node are hold at a low level under a control of the first clock signal and the third clock signal; and in the level reverse stage, the voltages at the pulling-up node and the pulling-down node are reversed under a control of the fourth clock signal.

11. The driving method of the gate driver circuit of claim 9, wherein duration of active level of each of the first clock signal, the second clock signal, the third clock signal and the fourth clock signal is a quarter period, and the active level is a high level.

12. The driving method of the gate driver circuit of claim 9, wherein a forward driving mode or a backward driving mode is employed, wherein, in the forward driving mode, the first clock signal, the second clock signal, the third clock signal and the fourth clock signal are successively set to be the active level, and the active levels of these clock signals are successively lagged a quarter period; and in the backward driving mode, the fourth clock signal, the third clock signal, the second clock signal and the first clock signal are successively set to be the active level, and the active levels of these clock signals are successively lagged a quarter period; and wherein, the fourth clock signal in the backward driving mode is a quarter period ahead of the first clock signal in the forward driving mode.

* * * * *